United States Patent
Pritchett

(12) 
(10) Patent No.: US 6,500,764 B1
(45) Date of Patent: Dec. 31, 2002

(54) METHOD FOR THINNING A SEMICONDUCTOR SUBSTRATE

(75) Inventor: Steve Pritchett, Salt Lake County, UT (US)

(73) Assignee: Fairchild Semiconductor Corporation, South Portland, MA (US)

( * ) Notice: Subject to any disclaimer, the term of this patent is extended or adjusted under 35 U.S.C. 154(b) by 0 days.

(21) Appl. No.: 10/021,547

(22) Filed: Oct. 29, 2001

(51) Int. Cl.[7] .............................................. H01L 21/302
(52) U.S. Cl. ........................ 438/690; 257/737; 257/786
(58) Field of Search .................................. 438/759–760, 438/106–127, 455–459, 689–692; 257/737, 786

(56) References Cited

U.S. PATENT DOCUMENTS 5,851,845 A * 12/1998 Wood et al. ................ 438/107
6,022,792 A * 2/2000 Ishii et al. .................. 438/462
6,245,677 B1 * 6/2001 Haq .......................... 438/690

FOREIGN PATENT DOCUMENTS

JP 06029296 * 2/1994 ................ 257/734

* cited by examiner

Primary Examiner—Phat X. Cao
Assistant Examiner—Thao X. Le
(74) Attorney, Agent, or Firm—Townsend and Townsend & Crew LLP

(57) ABSTRACT

A method for thinning a semiconductor substrate that does not impose a significant risk of breakage on the semiconductor substrate itself and is compatible with semiconductor wafers having electrically active bumps thereon. The method includes first forming at least one dummy bump on a semiconductor substrate (e.g., a silicon semiconductor wafer with electrically active bumps formed thereon). The dummy bumps are arranged on the semiconductor substrate (e.g., along its perimeter) in a manner that reduces a risk of establishing localized stress therein of a magnitude sufficient to result in breakage of the semiconductor substrate during a subsequent thinning step. The semiconductor substrate is then thinned using a mechanical backgrinding technique.

14 Claims, 3 Drawing Sheets

METHOD FOR THINNING A SEMICONDUCTOR SUBSTRATE

BACKGROUND OF THE INVENTION

1. Field of the Invention

The present invention relates, in general, to semiconductor device manufacturing and packaging methods and, in particular, to methods for thinning semiconductor wafers.

2. Description of the Related Art

Semiconductor devices, such as integrated circuits, are typically manufactured in and on a semiconductor substrate (e.g., a semiconductor wafer). The thickness of semiconductor wafers is predetermined, based on the semiconductor wafer's diameter, to avoid breakage and/or warpage during manufacturing. For example, the thickness of a 150 mm diameter silicon semiconductor wafer is approximately 650 microns, while that of a 200 mm diameter silicon semiconductor wafer is approximately 725 microns.

Following their manufacture, individual semiconductor devices (i.e., die) are packaged in order to provide electrical connections to an external system and protection from deleterious environmental factors (e.g., moisture). To facilitate the use of uniformly sized packages and to reduce substrate resistance, semiconductor wafers are usually thinned prior to packaging of the individual semiconductor devices. Semiconductor wafers are also thinned in order to minimize the effects of thermal coefficient of expansion mismatch between an individual semiconductor device and a package. Such thinning is referred to as "backgrinding," since it is conventionally accomplished by mechanically grinding the lower surface (i.e., back) of the semiconductor wafer. The backgrinding process employs methods to protect semiconductor devices on the upper surface (i.e., front) of the semiconductor wafer and to securely hold the semiconductor wafer. A conventional method of protection is the application of a protective tape over the upper surface.

Following the backgrinding process, the semiconductor device is packaged and electrically connected to an external system. For example, in "flip chip" packaging processes, bond pads (for the provision of input signals, output signals, supply voltage and ground) on a semiconductor device are directly connected to package or circuit board bond pads via bumps (e.g., solder bumps) formed on the bond pads. During such a flip chip packaging process, a semiconductor device with attached solder bumps is flipped over and aligned with package or circuit board bond pads. The solder bumps are then subjected to reflow processing in order to attach the bond pads of the semiconductor device to the package or circuit board bond pads.

A drawback of employing bumps, however, is that the bumps produce points of high localized stress in the semiconductor wafer during the backgrinding processes. These high localized stress points can cause some semiconductor wafers to break during the backgrinding process, even in the presence of a protective tape covering the bumps and upper surface of the semiconductor wafers. If the semiconductor wafers are subjected to a backgrinding process prior to the formation of the bumps, the bump formation process can impose a significant risk of breakage to the thinned semiconductor wafers.

Still needed in the field, therefore, is a method of thinning a semiconductor substrate (e.g., a semiconductor wafer) that does not impose a significant risk of breakage on the semiconductor substrate. In addition, the method should be compatible with semiconductor wafers that have bumps on their upper surface.

BRIEF SUMMARY OF THE INVENTION

The present invention provides methods for thinning a semiconductor substrate that do not impose a significant risk of breakage on the semiconductor substrate and are compatible with semiconductor wafers having conventional electrically active bumps thereon. A process according to one exemplary embodiment of the present invention includes first forming at least one dummy bump on a semiconductor substrate (e.g., a silicon semiconductor wafer with electrically active bumps formed thereon). The dummy bumps are arranged on the semiconductor substrate (e.g., along its perimeter) in a manner that reduces a risk of establishing localized stress therein that is sufficient to result in breakage of the semiconductor substrate during a subsequent thinning step. The semiconductor substrate is subsequently thinned using, for example, a mechanical backgrinding process.

Localized stress within a semiconductor wafer with electrically active bumps formed thereon is enhanced when a significant portion of the semiconductor wafer (e.g., a portion from which the manufacturing of complete semiconductor devices has been excluded) remains free of such electrically active bumps. The formation of dummy bumps in that portion precludes such stress enhancement and consequently reduces a risk of semiconductor wafer breakage during mechanical backgrinding.

A better understanding of the features and advantages of the present invention will be obtained by reference to the following detailed description that sets forth illustrative embodiments, in which the principles of the invention are utilized, and the accompanying drawings.

DETAILED DESCRIPTION OF THE INVENTION

To be consistent throughout the present specification and for clear understanding of the present invention, the following definitions are hereby provided for terms used therein:

The expression "dummy bump(s)" refers to a bump(s), which is not configured to provide an electrical connection between a semiconductor device and an external system (e.g., a package, printed circuit board or other system known in the field) during operation of the semiconductor device. In this respect, a dummy bump is considered an electrically inactive bump.

The expression "electrically active bump(s)" refers to a bump(s), which is configured to provide an electrical connection between a semiconductor device and an external system (e.g., a package, printed circuit board or other external system known in the field) during operation of the semiconductor device. Such an electrically active bump is configured for the provision of, for example, input signals, output signals, supply voltage and ground to the semiconductor device.

Figure 1:
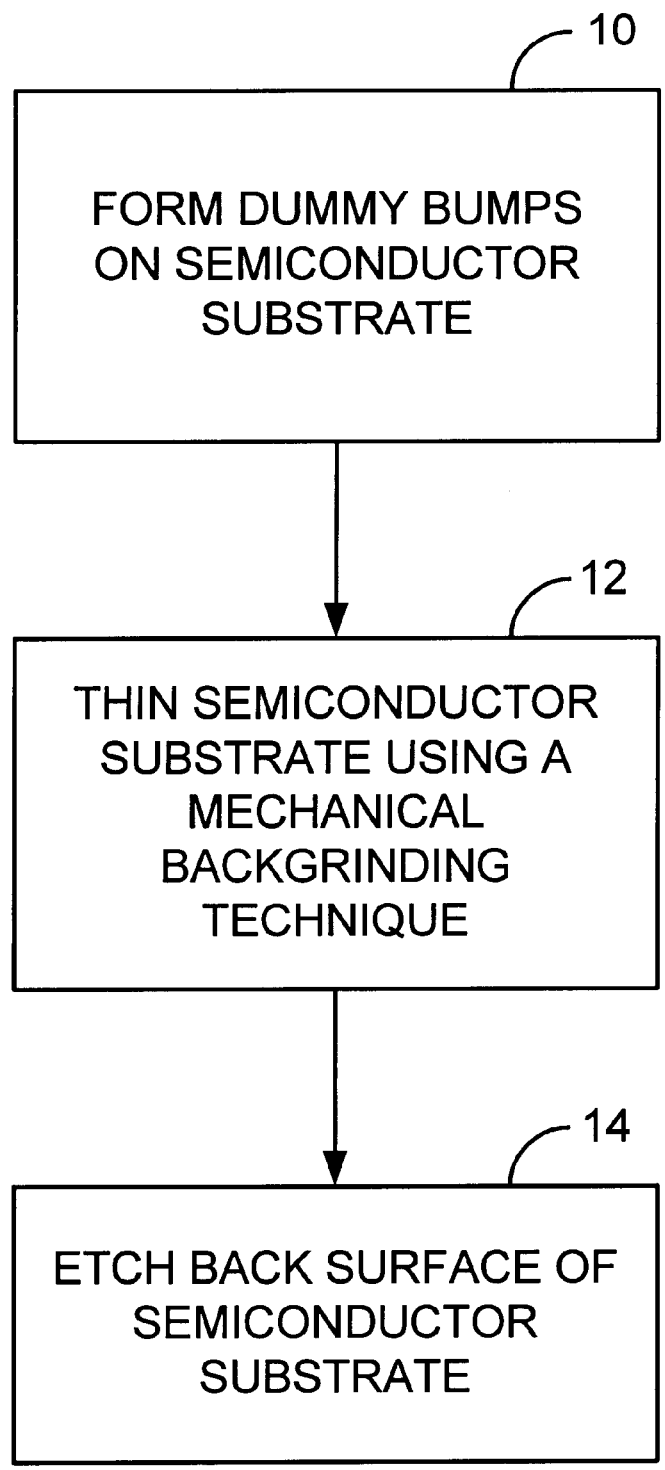
FIG. 1 is a flow diagram illustrating the sequence of steps in a process according to one exemplary embodiment of the present invention.

FIG. 1 is a flow diagram illustrating the sequence of steps in a process for thinning a semiconductor substrate according to one exemplary embodiment of the present invention. The semiconductor substrate can be any semiconductor substrate known in the field of semiconductor manufacturing. Such semiconductor substrates include, for example, a silicon semiconductor wafer with semiconductor devices (e.g., integrated circuits or discrete transistor devices) formed thereon. The semiconductor substrate can also be a silicon semiconductor wafer with electrically active bumps formed thereon.

First, dummy bumps are formed on the semiconductor substrate, as in step 10. The dummy bumps can be formed, for example, using conventional electrically active bump formation techniques known to one skilled in the art of semiconductor device manufacturing. The dummy bumps can also be formed at the same time that conventional electrically active bumps are formed.

The dummy bumps can be formed of any suitable material including, for example, solder and other electrically conductive materials used to form conventional electrically active bumps. The number, location, size and spacing of the dummy bumps on the semiconductor substrate are predetermined to reduce a risk of establishing high localized stress therein sufficient to result in breakage of the semiconductor substrate during a subsequent thinning step (described below). For example, forming dummy bumps around the perimeter (i.e., edge) of the semiconductor wafer helps prevent the establishment of high localized stress at the semiconductor wafer edge. Forming the dummy bumps of the same material and size as conventional electrically active bumps can also lower a risk of establishing high localized stress at the semiconductor wafer edge. As a consequence, the rate of semiconductor wafer breakage during a subsequent thinning step is reduced.

Semiconductor devices are typically manufactured in and on a semiconductor substrate in a manner that produces two portions of the semiconductor substrate: a first portion with complete semiconductor devices formed thereon and a second portion without any complete semiconductor devices formed thereon. This second portion can be either entirely devoid of semiconductor devices or include partially formed semiconductor devices. If desired, the forming step can include forming dummy bumps on such a second portion of the semiconductor substrate (i.e., where no semiconductor devices have been formed or only partial semiconductor devices have been formed). Since electrically active bumps are not conventionally formed in portions of the semiconductor substrate where no semiconductor devices have been formed, forming dummy solder bumps in those portions serves to equalize the stress across the entire semiconductor substrate. In this circumstance, the forming step can further include forming electrically active bumps at least on the first portion of the semiconductor substrate.

Figure 2:
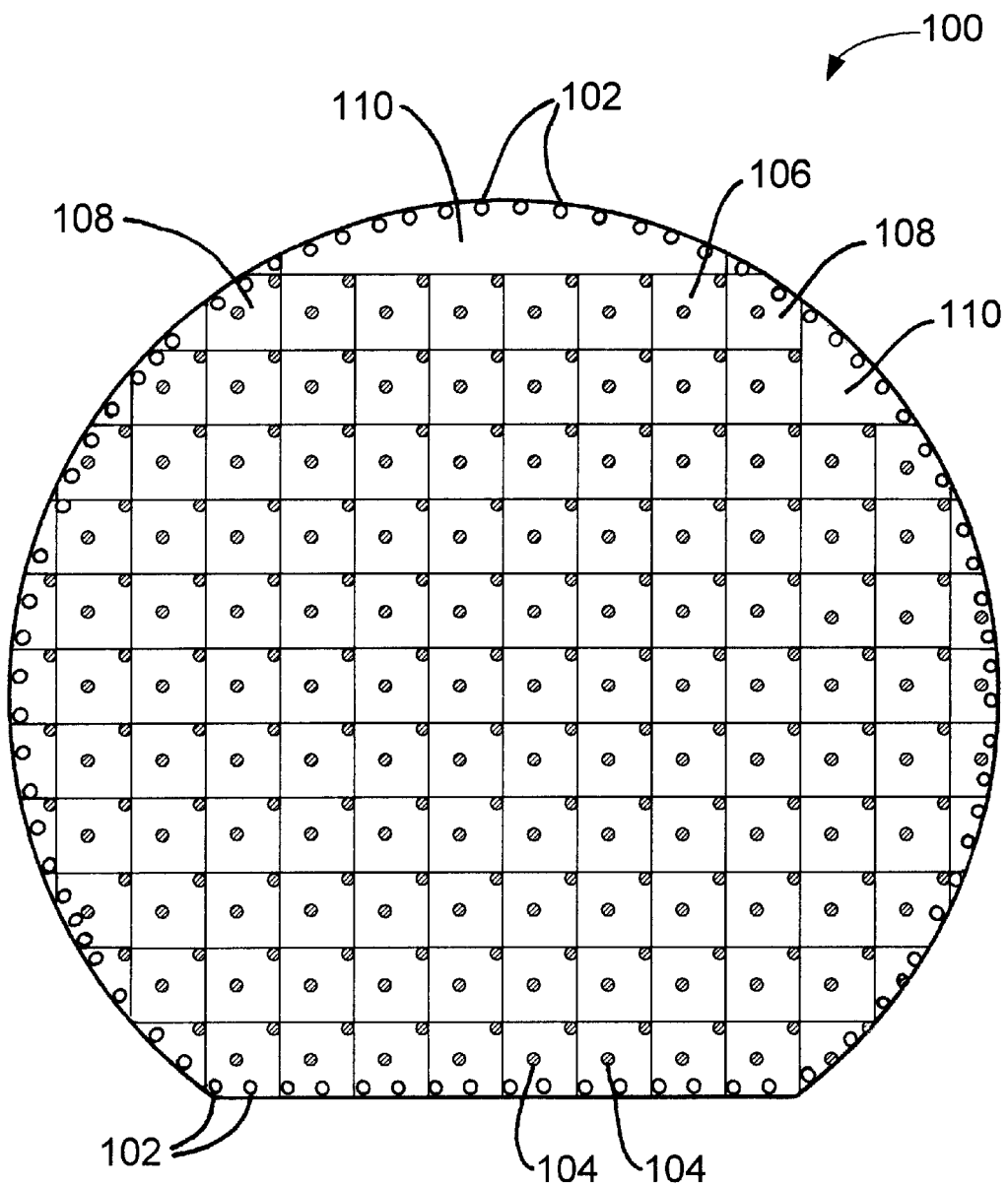
FIG. 2 is a sketch illustrating a silicon semiconductor wafer following a forming step in a process in accordance with one exemplary embodiment of the present invention.

FIG. 2 is a sketch illustrating a silicon semiconductor wafer 100 after the forming step in a process according to one exemplary embodiment of the present invention. Silicon semiconductor wafer 100 has a plurality of dummy bumps 102 (illustrated by open circles) formed along the perimeter (i.e., edge) of its upper surface. Silicon semiconductor wafer 100 also has electrically active bumps 104 (illustrated by shaded circles) formed on complete semiconductor devices 106 (depicted as rectangles) and partial semiconductor devices 108 (shown as non-rectangular areas containing at least one electrically active bump 104). Silicon semiconductor wafer 100 also includes areas 110 on its upper surface, from which complete semiconductor devices are entirely absent.

Figure 3:
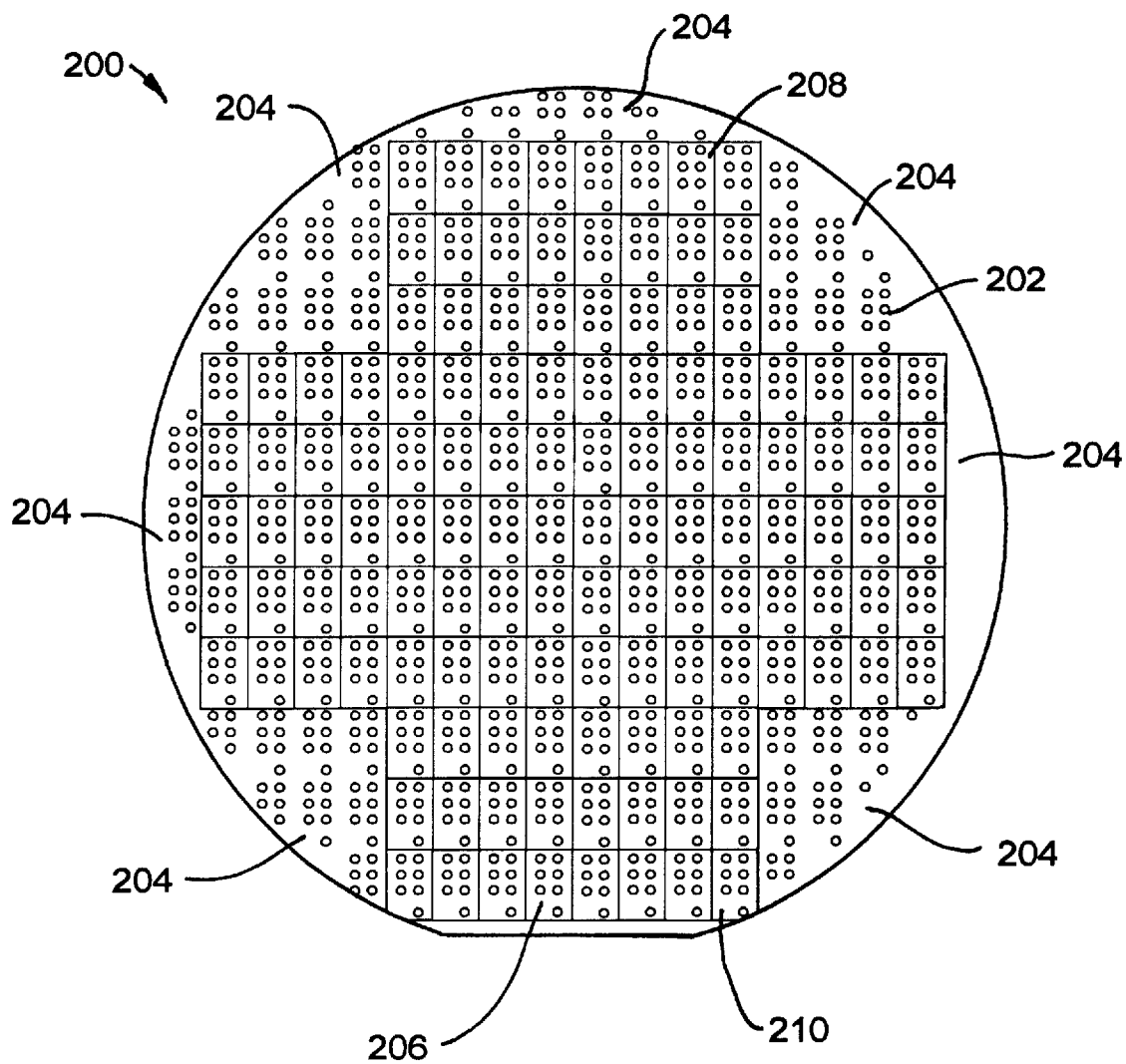
FIG. 3 is a sketch illustrating a silicon semiconductor wafer following a thinning step in a process according to another exemplary embodiment of the present invention.

FIG. 3 is a sketch illustrating a silicon semiconductor wafer 200 after the forming step in a process according to another exemplary embodiment of the present invention. Silicon semiconductor wafer 200 has a plurality of dummy bumps 202 (illustrated by open circles) formed in areas 204 on the upper surface of silicon semiconductor wafer 200 from which complete semiconductor devices are entirely absent. Silicon semiconductor wafer 200 also has electrically active bumps 206 (illustrated by shaded circles) formed on complete semiconductor devices 208 (depicted as rectangles) and partial semiconductor devices 210 (shown as non-rectangular areas with at least one electrically active bump 206). In the embodiment of FIG. 3, the dummy bumps 202 are in a repeating pattern that essentially mimics the pattern of the electrically active bumps 206. In this circumstance, only one pattern of bumps (either dummy and electrically active) need be created.

Referring again to FIG. 1, subsequent to the formation of dummy bumps, the semiconductor substrate is thinned using a mechanical backgrinding technique (e.g., to a thickness of 300 microns or 100 microns), as in step 12. The mechanical backgrind technique can be any mechanical backgrinding technique known to one skilled in the art. For a 200 mm diameter silicon semiconductor wafer, the thinning step can reduce the thickness of a silicon semiconductor wafer to, for example, a thickness in the range of 300 microns to 500 microns. To mediate stress inducing effects of any electrically active bumps present on the semiconductor substrate, a flexible protective tape can be applied, if desired, over the at least one dummy bump, the electrically active bumps and on the semiconductor substrate prior to the thinning step. Alternatively, the electrically active bumps, dummy bumps and semiconductor substrate can be protected, and a planar surface established, by applying a protective and planarizing layer of photoresist, or wax, or flexible protective tape, or a combination thereof over the at least one dummy bump, the electrically active bumps and the semiconductor substrate prior to the thinning step.

The semiconductor substrate can also be optionally thinned further via etching of the back surface of the semiconductor substrate. The etching can employ a chemical etching technique (e.g., a wet chemical or plasma etching technique), as in step 14. The wet chemical or plasma etching technique can be any such technique known by one skilled in the art to be suitable for etching semiconductor substrates. When such a chemical etching technique is employed, the thickness of the semiconductor wafer following the mechanical backgrind technique (i.e., following step 12) will be thicker than the final desired thickness. The use of a chemical etching technique to further thin the semiconductor substrate, thus, reduces the amount of semiconductor substrate removed during the mechanical backgrinding technique and further reduces breakage.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A method for thinning a semiconductor substrate, the semiconductor substrate including a first portion having complete semiconductor devices formed thereon and a second portion not having complete semiconductor devices formed thereon, the method comprising:

forming one or more dummy bumps on the second portion of the semiconductor substrate; and thinning the semiconductor substrate;

wherein the one or more dummy bumps are arranged on the semiconductor substrate in a manner that reduces a risk of establishing localized stress therein.

2. The method of claim 1, wherein the semiconductor substrate is a silicon semiconductor wafer.

3. The method of claim 1, wherein the dummy bumps are dummy solder bumps.

4. The method of claim 1, further comprising during the forming step, forming dummy bumps along the perimeter of the semiconductor substrate.

5. The method of claim 1, further comprising during the forming step, forming dummy bumps on the second portion of the semiconductor substrate, the second portion lying along a perimeter of the semiconductor substrate.

6. The method of claim 1, further comprising prior to the thinning step, forming electrically active bumps on at least the first portion of the semiconductor substrate.

7. The method of claim 1 further comprising, after the thinning step, etching the back surface of the semiconductor substrate to further thin the semiconductor substrate.

8. The method of claim 7 wherein the etching step is accomplished using a wet chemical etching technique.

9. The method of claim 7, wherein the etching step is accomplished using a plasma etching technique.

10. The method of claim 6 further comprising, after the forming steps and before the thinning step, applying flexible protective tape over the dummy bumps, the electrically active bumps and the semiconductor substrate.

11. The method of claim 6 further comprising, after the forming steps and before the thinning step, applying a protective and planarizing layer of wax over the dummy bumps, the electrically active bumps and the semiconductor substrate.

12. The method of claim 6 further comprising, after the forming steps and before the thinning step, applying a protective and planarizing layer of photoresist over the dummy bumps, the electrically active bumps and the semiconductor substrate.

13. The method of claim 1, further comprising during the thinning step, thinning the semiconductor substrate using a mechanical backgrinding technique.

14. The method of claim 6, wherein the electrically active bumps are formed in a first repeating pattern and the dummy bumps are formed in a second repeating pattern substantially matching the first repeating pattern.

* * * * *